US010790792B2

(12) United States Patent
 Nakaiso

(10) Patent No.: US 10,790,792 B2
(45) Date of Patent: Sep. 29, 2020

(54) LC COMPOSITE DEVICE, PROCESSOR, AND METHOD FOR MANUFACTURING LC COMPOSITE DEVICE

(71) Applicant: Murata Manufacturing Co., Ltd., Nagaokakyo-shi, Kyoto-fu (JP)

(72) Inventor: Toshiyuki Nakaiso, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 9 days.

(21) Appl. No.: 15/954,908

(22) Filed: Apr. 17, 2018

(65) Prior Publication Data

US 2018/0234070 A1    Aug. 16, 2018

Related U.S. Application Data

(63) Continuation of application No. PCT/JP2016/081036, filed on Oct. 20, 2016.

(30) Foreign Application Priority Data

Oct. 30, 2015    (JP) .................................. 2015-213768

(51) Int. Cl.
*H01H 9/28*        (2006.01)
*H03H 1/00*        (2006.01)
(Continued)

(52) U.S. Cl.
CPC ........... *H03H 1/00* (2013.01); *H01F 17/0013* (2013.01); *H01F 27/24* (2013.01);
(Continued)

(58) Field of Classification Search
CPC .. H03H 1/00; H03H 3/00; H01F 27/24; H01F 27/40; H01F 27/29; H01F 27/2804; H01F 41/042; H01G 4/40; H02M 3/155
(Continued)

(56) References Cited

U.S. PATENT DOCUMENTS 5,604,383 A    2/1997   Matsuzaki
6,930,584 B2 *  8/2005   Edo ..................... H01F 17/0033
                                                257/E27.116
(Continued)

FOREIGN PATENT DOCUMENTS

JP    H07307440 A    11/1995
JP    H09213894 A     8/1997
(Continued)

OTHER PUBLICATIONS

International Search Report issued in International Application No. PCT/JP2016/081036, dated Dec. 13, 2016.
(Continued)

*Primary Examiner* — Jared Fureman
*Assistant Examiner* — Lucy M Thomas
(74) *Attorney, Agent, or Firm* — Arent Fox LLP

(57) ABSTRACT

An LC composite device includes a capacitor portion, an inductor portion, and a magnetic body portion. The capacitor portion is configured of a first substrate and a thin film capacitance element formed on the first substrate through a thin film process. The inductor portion is configured of a second substrate and a thin film inductance element formed on the second substrate through a thin film process. The magnetic body portion includes a magnetic substrate, and the capacitor portion. The inductor portion and the magnetic body portion are stacked in a positional relationship in which the magnetic body portion and the inductor portion are in contact with each other.

18 Claims, 9 Drawing Sheets

(51) Int. Cl.
| | |
|---|---|
| *H01G 4/40* | (2006.01) |
| *H01L 21/822* | (2006.01) |
| *H05K 1/16* | (2006.01) |
| *H05K 3/46* | (2006.01) |
| *H01F 17/00* | (2006.01) |
| *H01F 41/04* | (2006.01) |
| *H01F 27/29* | (2006.01) |
| *H01F 27/24* | (2006.01) |
| *H01F 27/28* | (2006.01) |
| *H01F 27/40* | (2006.01) |
| *H02M 3/155* | (2006.01) |
| *H03H 3/00* | (2006.01) |
| *H02M 3/156* | (2006.01) |
| *H02M 1/44* | (2007.01) |
| *H03H 7/01* | (2006.01) |

(52) U.S. Cl.
CPC ......... *H01F 27/2804* (2013.01); *H01F 27/29* (2013.01); *H01F 27/40* (2013.01); *H01F 41/042* (2013.01); *H01F 41/046* (2013.01); *H01G 4/40* (2013.01); *H01L 21/822* (2013.01); *H02M 3/155* (2013.01); *H03H 3/00* (2013.01); *H05K 1/162* (2013.01); *H05K 1/165* (2013.01); *H05K 3/4605* (2013.01); *H01F 2017/0026* (2013.01); *H01F 2027/2809* (2013.01); *H02M 1/44* (2013.01); *H02M 3/156* (2013.01); *H03H 7/0115* (2013.01); *H03H 2001/0057* (2013.01); *H03H 2001/0085* (2013.01); *H05K 2201/086* (2013.01)

(58) Field of Classification Search
USPC ........................................................ 361/270
See application file for complete search history.

(56) References Cited

U.S. PATENT DOCUMENTS

| | | | |
|---|---|---|---|
| 7,154,162 | B2 | 12/2006 | Ahn et al. |
| 8,786,379 | B2* | 7/2014 | Nakagawa ............... H03H 7/09 333/12 |
| 2004/0075131 | A1 | 4/2004 | Ahn et al. |
| 2007/0072319 | A1 | 3/2007 | Ahn et al. |
| 2015/0255722 | A1* | 9/2015 | Lee ..................... H01L 51/0024 438/25 |
| 2016/0035988 | A1* | 2/2016 | Lee ....................... B32B 27/283 257/40 |

FOREIGN PATENT DOCUMENTS

| | | |
|---|---|---|
| JP | H09270338 A | 10/1997 |
| JP | H09294040 A | 11/1997 |
| JP | 2001044778 A | 2/2001 |
| JP | 2002233140 A | 8/2002 |
| JP | 2004165372 A | 6/2004 |
| JP | 2006311203 A | 11/2006 |
| JP | 2006324572 A | 11/2006 |
| JP | 2007288104 A | 11/2007 |
| JP | 2011139092 A | 7/2011 |

OTHER PUBLICATIONS

Written Opinion of the International Searching Authority issued in International Application No. PCT/JP2016/081036, dated Dec. 13, 2016.

* cited by examiner

LC COMPOSITE DEVICE, PROCESSOR, AND METHOD FOR MANUFACTURING LC COMPOSITE DEVICE

CROSS REFERENCE TO RELATED APPLICATIONS

The present application is a continuation of International application No. PCT/JP2016/081036, filed Oct. 20, 2016, which claims priority to Japanese Patent Application No. 2015-213768, filed Oct. 30, 2015, the entire contents of each of which are incorporated herein by reference.

TECHNICAL FIELD

The present invention relates to an LC composite device including an inductor and a capacitor, a processor including the LC composite device, and a method for manufacturing the LC composite device.

BACKGROUND ART

In order to miniaturize a power supply device such as a DC/DC converter or the like, attempts have been made to incorporate an inductor or a capacitor necessary for a power supply circuit in a power supply IC (for example, Japanese Unexamined Patent Application Publication No. 7-307440, Japanese Unexamined Patent Application Publication No. 9-213894, and Japanese Unexamined Patent Application Publication No. 2007-288104.

It is difficult to increase the coil size in a case where a coil is incorporated in an IC, and thus a magnetic body film is formed on a base material through a thin film process in order to obtain a predetermined inductance with a small-sized coil as disclosed in the foregoing published applications.

However, in an existing thin film process, it is difficult to form a magnetic body film with high magnetic permeability. Accordingly, there is a problem that it is difficult to configure a power supply circuit including an inductor with a predetermined high inductance.

As described above, in a small-sized device in which an inductor and a capacitor are formed by a conductor pattern, it is particularly difficult to configure an inductor with a predetermined high inductance.

An object of the present invention is to provide an LC composite device including an inductor with a predetermined high inductance, a processor including the LC composite device, and a method for manufacturing the LC composite device by solving the above-described problem.

BRIEF SUMMARY OF THE INVENTION

An LC composite device includes a capacitor portion comprising a first substrate and a thin film capacitance element located on the first substrate. An inductor portion comprising a second substrate and a thin film inductance element is located on the second substrate. A magnetic body portion comprises a magnetic substrate, the magnetic body portion being in contact with the inductor portion.

In one embodiment, the magnetic body portion is a first magnetic body portion and the LC composite device further includes a second magnetic body portion. The second body portion comprises a second magnetic substrate. The inductor portion is sandwiched between the first and second magnetic body portions.

In some embodiments, the magnetic substrate of the first magnetic body portion has an outer surface on which a plurality of external terminals formed. Each of the external terminals are physically and electrically coupled a respective one of thin film capacitance element and the thin film inductance element.

In preferred embodiments, the first substrate is a semiconductor substrate, the second substrate is a glass substrate, and the magnetic substrate is a magnetic body ferrite board.

The invention is also directed towards the combination of a processor integrated circuit which includes a switching circuit of a switching power supply circuit and the foregoing LC composite device which is connected to the switching circuit.

The invention is also directed towards a method for manufacturing an LC composite device. The method comprises forming a capacitor portion by forming a thin film capacitance element on a first substrate, forming an inductor portion by forming a thin film inductance element on a second substrate, forming a magnetic portion by forming a conductor pattern including an external terminal on a magnetic substrate, and stacking and integrating the capacitor portion, the inductor portion and the magnetic body portion.

In some embodiments, the magnetic body portion is a first magnetic body portion and the method further comprises stacking and integrating a second magnetic substrate into the LC composite device such that the inductor portion is sandwiched between the first and second magnetic body portions.

In some embodiments the method also includes forming a plurality of external electrodes on an outer surface of the magnetic substrate of the first magnetic body portion and forming a physical and electrical connection between each of the external terminals and a respective one of thin film capacitance element and the thin film inductance element.

In some embodiments, the first substrate is a semiconductor substrate, the second substrate is a glass substrate, and the magnetic substrate is a magnetic body ferrite board.

By the above-described respective steps, the capacitor portion, the inductor portion, and the magnetic body portion can be respectively manufactured through independent processes, each of the portions can therefore be formed with ease. Additionally, a magnetic body layer with a sufficient high effective magnetic permeability to the thin film inductor can be formed with ease.

According to the present invention, a third substrate configured of a sintered body ferrite is brought close to a thin film inductance element formed on a second substrate, and thus an LC composite device having an inductor with a higher inductance while being smaller in size than a thin film inductor in which a thin film magnetic body film is formed is configured. Additionally, a small-sized processor including a switching power supply circuit is configured.

DESCRIPTION OF THE PREFERRED EMBODIMENTS

Figure 1:
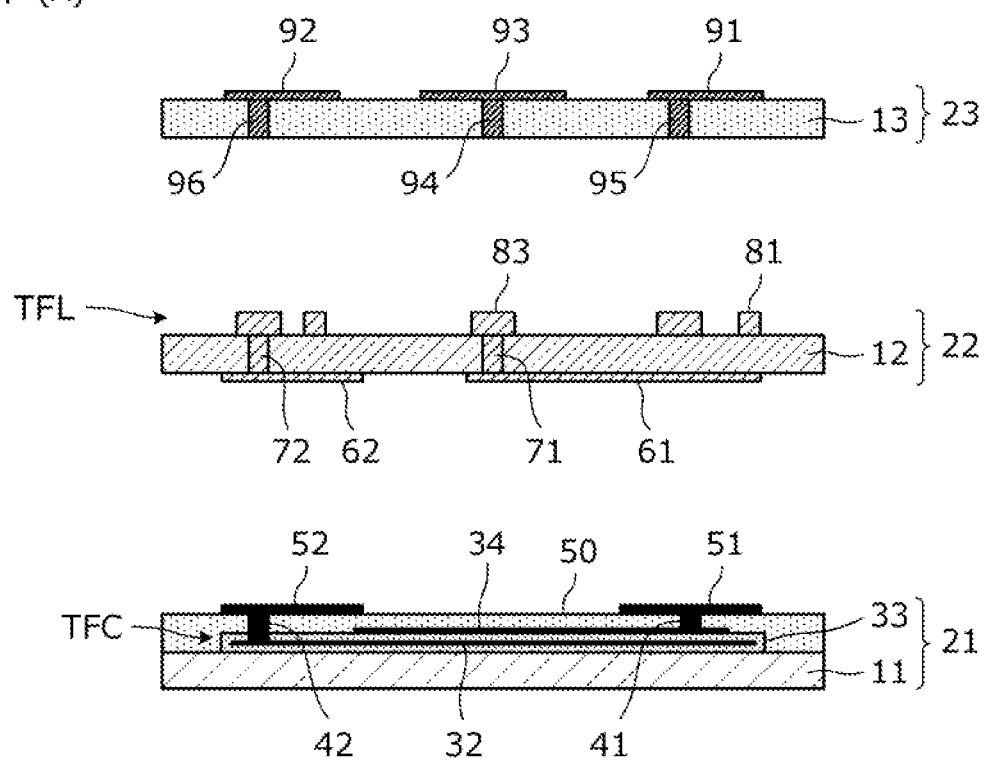
FIG. 1(A) is an exploded cross-sectional view of an LC composite device 201 according to a first embodiment.
FIG. 1(B) is a cross-sectional view of the LC composite device 201.
Figure 1:
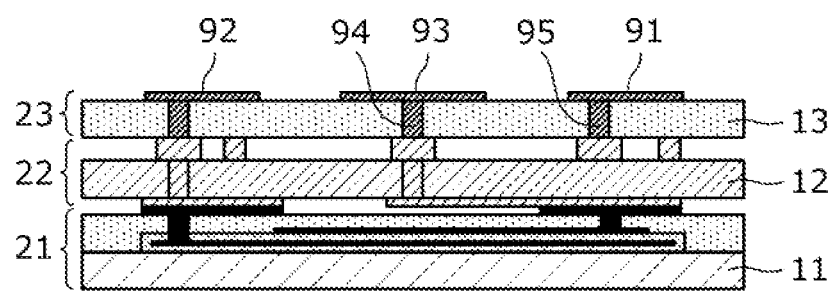

Several embodiments for carrying out the present invention will be described hereinafter with reference to the drawings, using several specific examples. Identical elements in the drawings are given the same reference numerals. Although, in consideration for description of main points or understandability, the embodiments are separately described for convenience, configurations described in different embodiments can partially replace each other or be combined. In a second and following embodiments, description of common points to those in a first embodiment will be omitted, and only different points will be described. In particular, the same actions and effects achieved by the same configurations are not stated for each embodiment.

Figure 2:
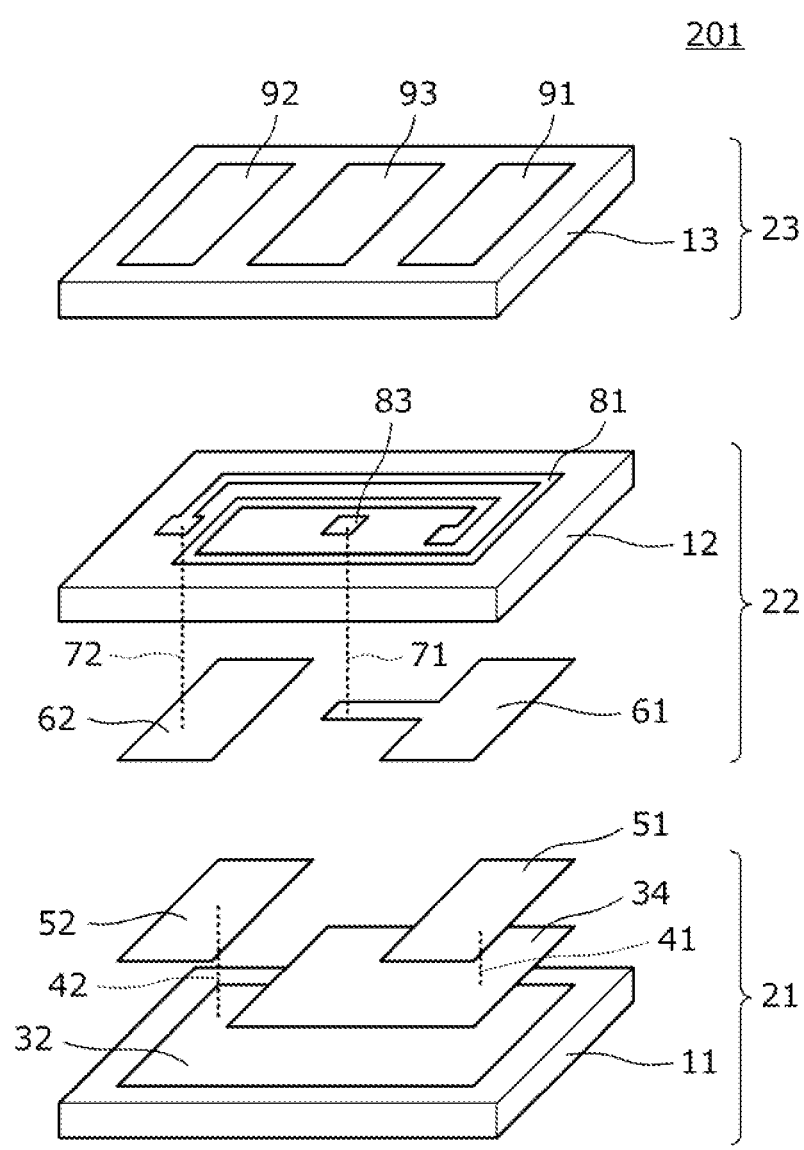
FIG. 2 is an exploded perspective view of the LC composite device 201.

FIG. 1(A) is an exploded cross-sectional view of an LC composite device 201 according to a first embodiment, FIG. 1(B) is a cross-sectional view of the LC composite device 201. FIG. 2 is an exploded perspective view of the LC composite device 201.

The LC composite device 201 of the present embodiment includes a capacitor portion 21, an inductor portion 22, and a magnetic body portion 23. The capacitor portion 21 is configured of a first substrate 11 and a thin film capacitance element TFC formed on the first substrate 11 through a thin film process, the inductor portion 22 is configured of a second substrate 12 and a thin film inductance element TFL formed on the second substrate 12 through a thin film process.

As illustrated in FIG. 1(B), in the LC composite device 201, the capacitor portion 21, the inductor portion 22, and the magnetic body portion 23 are stacked in a positional relationship in which the magnetic body portion 23 and the inductor portion 22 are in contact with each other.

On a first surface of the first substrate 11 (an upper surface in a direction illustrated in FIGS. 1(A) and 1(B) and FIG. 2), a lower capacitor electrode 32, an upper capacitor electrode 34, and a dielectric layer 33 sandwiched therebetween are formed through a thin film process. In the present embodiment, the dielectric layer 33 is also formed between the lower capacitor electrode 32 and the first substrate 11.

In an upper portion of a multilayer body of the lower capacitor electrode 32, the upper capacitor electrode 34, and the dielectric layer 33, an insulating film 50 is formed. On a surface of this insulating film 50, surface electrodes 51 and 52 are formed. Additionally, the thin film capacitance element TFC includes a via conductor 41 interlayer-connecting the upper capacitor electrode 34 and the surface electrode 51, and a via conductor 42 interlayer-connecting the lower capacitor electrode 32 and the surface electrode 52. Note that, the dielectric layer 33 and the insulating film 50 are not illustrated in FIG. 2.

On a first surface of the second substrate 12 (an upper surface in a direction illustrated in FIGS. 1(A) and 1(B) and FIG. 2), a coil conductor pattern 81 having a rectangular and spiral shape is formed. A surface electrode 83 is formed at or in the vicinity of the coil winding axis of the coil conductor pattern 81 (the center of a coil opening). Surface electrodes 61 and 62 are formed on a second surface of the second substrate 12. Additionally, in the second substrate 12, a via conductor 71 interlayer-connecting the surface electrode 61 and the surface electrode 83, and a via conductor 72 interlayer-connecting the surface electrode 62 and an outer terminal end of the coil conductor pattern 81 are each formed.

The magnetic body portion 23 includes a magnetic substrate 13. On a first surface of the magnetic substrate 13 (an upper surface in a direction illustrated in FIGS. 1(A) and 1(B) and FIG. 2), external terminals 91, 92, and 93 are formed. Additionally, in the magnetic substrate 13, a via conductor 94 conducted to the surface electrode 83, a via conductor 95 conducted to an inner terminal end of the coil conductor pattern, and a via conductor 96 conducted to the outer terminal end of the coil conductor pattern are each formed in a stacked state with the inductor portion 22.

The above-described first substrate 11 is, for example, a high resistance Si semiconductor substrate, the lower capacitor electrode 32 and the upper capacitor electrode 34 are, for example, Pt films formed by sputtering. The dielectric layer 33 is, for example, a sintered body film of BST (barium strontium titanate, (Ba, Sr)TiO3) formed by repetition of a spin coat step and a firing step. The insulating film 50 is, for example, formed through spin-coating solder resist such as epoxy, polyimide, or the like. Note that, a plurality of sets of the upper capacitor electrode and the lower capacitor electrode may be stacked in a stacking direction.

The dielectric layer 33 formed between the lower capacitor electrode 32 and the first substrate 11 enhances close contact strength of the lower capacitor electrode 32 to the first substrate 11.

The above-described second substrate 12 is, for example, a glass substrate. The coil conductor pattern 81 and the surface electrodes 61, 62, and 83 are, for example, formed through patterning by formation of a Cu plating film and photolithography thereof. Alternatively, they are formed, e.g., through patterning of a photosensitive conductive paste.

The above-described magnetic substrate 13 is preferably a sintered magnetic body ferrite board, the external terminals 91, 92, and 93 and the via conductors 94, 95, and 96 are formed through print-forming and integral firing of an Ag paste.

By stacking, and then heating and pressurizing the capacitor portion 21, the inductor portion 22, and the magnetic body portion 23, as illustrated in FIG. 1(B), a multilayer body thereof is configured. This multilayer body is the LC composite device 201.

In this state, the surface electrodes 51 and 52 of the capacitor portion 21 are respectively conducted (physically and electronically coupled) to the surface electrodes 61 and 62 of the inductor portion 22. Additionally, the surface electrode 83 of the inductor portion 22 is conducted to the external terminal 93 with the via conductor 94 interposed therebetween, the inner terminal end of the coil conductor pattern 81 is conducted to the external terminal 91 with the via conductor 95 interposed therebetween, and the outer terminal end of the coil conductor pattern 81 is conducted to the external terminal 92 with the via conductor 96 interposed therebetween.

By applying or forming a conductive member such as solder, an Au bump, a conductive paste, or the like on surfaces of the surface electrodes 51 and 52 of the capacitor portion 21 or surfaces of the surface electrodes 61 and 62 of the inductor portion 22, and stacking, heating, and pressurizing the portions, the surface electrodes 51 and 52 of the capacitor portion 21 and the surface electrodes 61 and 62 of the inductor portion 22 are respectively bonded with each other with the above-described conductive member interposed therebetween.

Additionally, by applying or forming a conductive member such as solder, an Au bump, a conductive paste, or the like on the surface electrode 83 and the inner terminal end and the outer terminal end of the coil conductor pattern of the inductor portion 22, or the via conductors 94, 95, and 96 on a second surface of the magnetic substrate 13, and stacking, heating, and pressurizing them, the surface electrode 83 and the inner terminal end and the outer terminal end of the coil conductor pattern of the inductor portion 22, and the via conductors 94, 95, and 96 of the magnetic substrate 13 are respectively bonded with each other with the above-described conductive member interposed therebetween.

The thickness of each of the capacitor portion 21, the inductor portion 22, and the magnetic body portion 23 is preferably from 50 µm to 150 µm. In particular, each thickness can be made not more than 0.1 mm, the thickness of the LC composite device can also be made approximately 0.3 mm, and thus an ultra-thin type thin film device can be configured. Additionally, the first substrate 11 configuring the capacitor portion 21, the second substrate 12 configuring the inductor portion 22, and the magnetic substrate 13 configuring the magnetic body portion 23 are preferably all rectangular in shape in a plan view, and have almost the same outer dimension.

Figure 3:
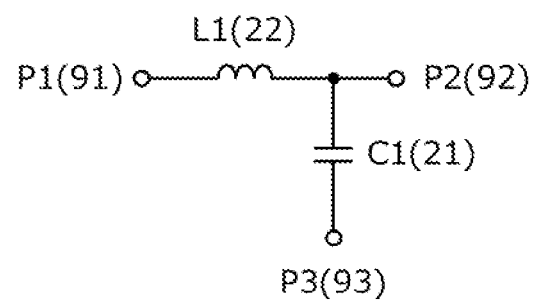
FIG. 3 is a circuit diagram of the LC composite device 201.

FIG. 3 is a circuit diagram of the LC composite device 201. An inductor L1 corresponds to the above-described inductor portion 22, and a capacitor C1 corresponds to the above-described capacitor portion 21. Additionally, terminals P1, P2, and P3 correspond to the above-described external terminals 91, 92, and 93, respectively. Here, by connecting the terminal P3 to the ground of the circuit, and connecting the terminal P1 to an input portion and connecting the terminal P2 to an output portion, the device can be used as a smoothing circuit or a low pass filter.

According to the present embodiment, optimum substrate materials, electrode materials, and processes for each of the capacitor portion, the inductor portion, and the magnetic body portion can be selected, and a composite device capable of optimizing characteristics of each of the elements and having excellent electrical characteristics while being the LC composite device can be realized. Additionally, the following effects are also achieved.

(1) The layer of the magnetic body is not formed through the thin film process, but is a magnetic substrate (e.g., a sintered ferrite board), the layer with high magnetic permeability can therefore be formed.

(2) The magnetic substrate 13 is in contact with the coil conductor pattern 81, and thus the magnetic substrate 13 acts as a magnetic path of the inductor. In other words, in comparison with a case where the inductor portion 22 is individually configured, the magnetic permeability in the vicinity of the coil conductor pattern 81 increases, and a predetermined higher inductance can be obtained while being smaller in size.

(3) The coil conductor pattern is not formed on a magnetic substrate with large surface roughness and integrally fired, but the coil conductor pattern is formed on the second substrate with high smoothness (glass substrate), the coil conductor pattern can therefore be formed with high accuracy.

(4) The coil conductor pattern is not formed on the magnetic substrate, the magnetic substrate can therefore be reduced in thickness, and the LC composite device having an inductor with a large inductance despite being small and thin can be obtained.

In a second embodiment, an LC composite device including a plurality of magnetic substrates will be described.

Figure 4:
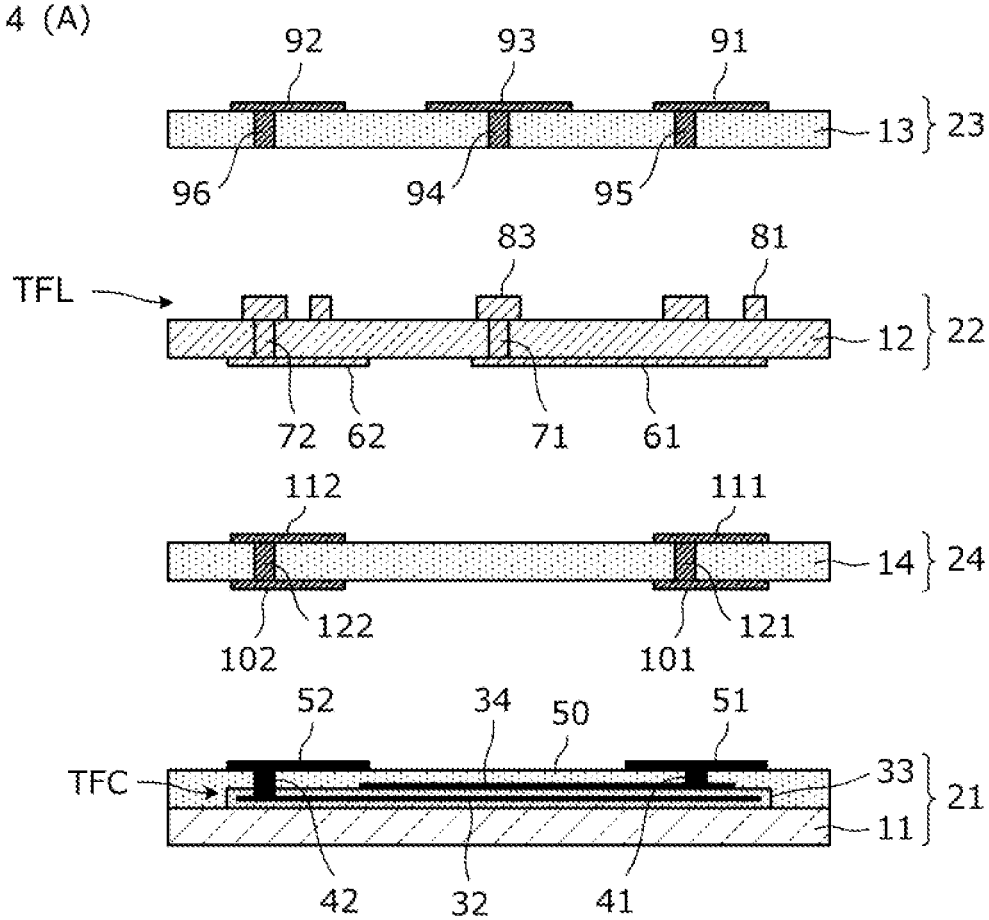
FIG. 4(A) is an exploded cross-sectional view of an LC composite device 202 according to a second embodiment.
FIG. 4(B) is a cross-sectional view of the LC composite device 202.
Figure 4:
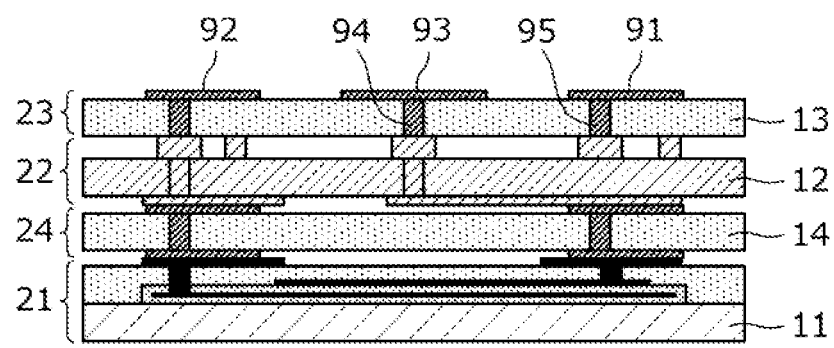
Figure 5:
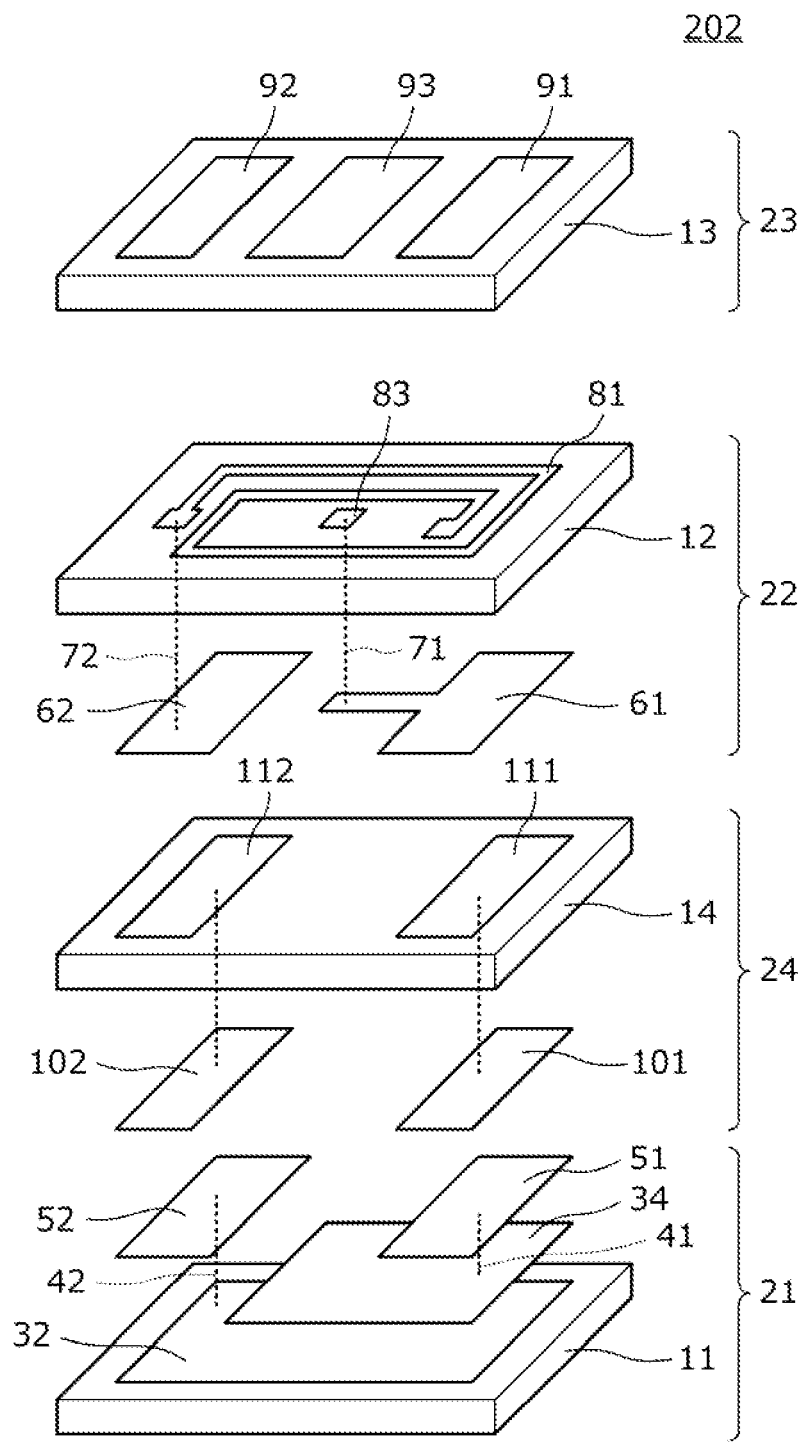
FIG. 5 is an exploded perspective view of the LC composite device 202.

FIG. 4(A) is an exploded cross-sectional view of an LC composite device 202 according to the second embodiment, FIG. 4(B) is a cross-sectional view of the LC composite device 202. Additionally, FIG. 5 is an exploded perspective view of the LC composite device 202.

The LC composite device 202 of the present embodiment includes the capacitor portion 21, the inductor portion 22, and the magnetic body portion 23. The capacitor portion 21 is configured of the first substrate 11 and the thin film capacitance element TFC formed on the first substrate 11 through the thin film process, the inductor portion 22 is configured of the second substrate 12 and the thin film inductance element TFL formed on the second substrate 12 through the thin film process.

As illustrated in FIG. 4(B), the inductor portion 22 of the LC composite device 202 is sandwiched between the magnetic body portion 23 and a magnetic body portion 24.

The magnetic body portion 24 includes a magnetic substrate 14. Surface electrodes 111 and 112 are formed on a first surface of the magnetic substrate 14 (an upper surface in a direction illustrated in FIGS. 4(A) and 4(B) and FIG. 5), surface electrodes 101 and 102 are formed on a second surface. Additionally, in the inside of the magnetic substrate 14, a via conductor 121 connecting the surface electrode 101 and the surface electrode 111 to each other and a via conductor 122 connecting the surface electrode 102 and the surface electrode 112 to each other are each formed.

The above-described magnetic substrate 14 is preferably a sintered magnetic body ferrite board, the surface electrodes 101, 102, 111, and 112 and the via conductors 121 and 122 are preferably formed through print-forming and integral firing of a Cu paste. Other configurations are the same as those of the LC composite device 201 described in the first embodiment.

By stacking, and then heating and pressurizing the capacitor portion 21, the inductor portion 22, and the magnetic body portions 23 and 24, as illustrated in FIG. 4(B), a multilayer body thereof is configured. This multilayer body is the LC composite device 202.

In this state, the surface electrodes 51 and 52 of the capacitor portion 21 are conducted (electrically and physically connected) to the surface electrodes 101 and 102 of the magnetic substrate 14, respectively, the surface electrodes 111 and 112 of the magnetic substrate 14 are conducted to the surface electrodes 61 and 62 of the inductor portion 22, respectively. Additionally, the surface electrode 83 of the inductor portion 22 is conducted to the external terminal 93 with the via conductor 94 interposed therebetween, the inner terminal end of the coil conductor pattern 81 is conducted to the external terminal 91 with the via conductor 95 interposed therebetween, and the outer terminal end of the coil conductor pattern 81 is conducted to the external terminal 92 with the via conductor 96 interposed therebetween.

According to the present embodiment, the inductor portion 22 of the LC composite device 202 is sandwiched between the magnetic body portions 23 and 24, and thus magnetic permeability in the vicinity of the coil conductor pattern 81 increases and a predetermined high inductance is obtained while being smaller in size. Additionally, by disposing the magnetic body portion 24 between the inductor portion 22 and the capacitor portion 21, a magnetic flux generated in the inductor portion is magnetically shielded. With this, it is possible to suppress an eddy current from occurring in a capacitor electrode or the like of the capacitor portion 21.

In a third embodiment, an LC composite device having coil conductor patterns formed across a plurality of layers will be described.

Figure 6:
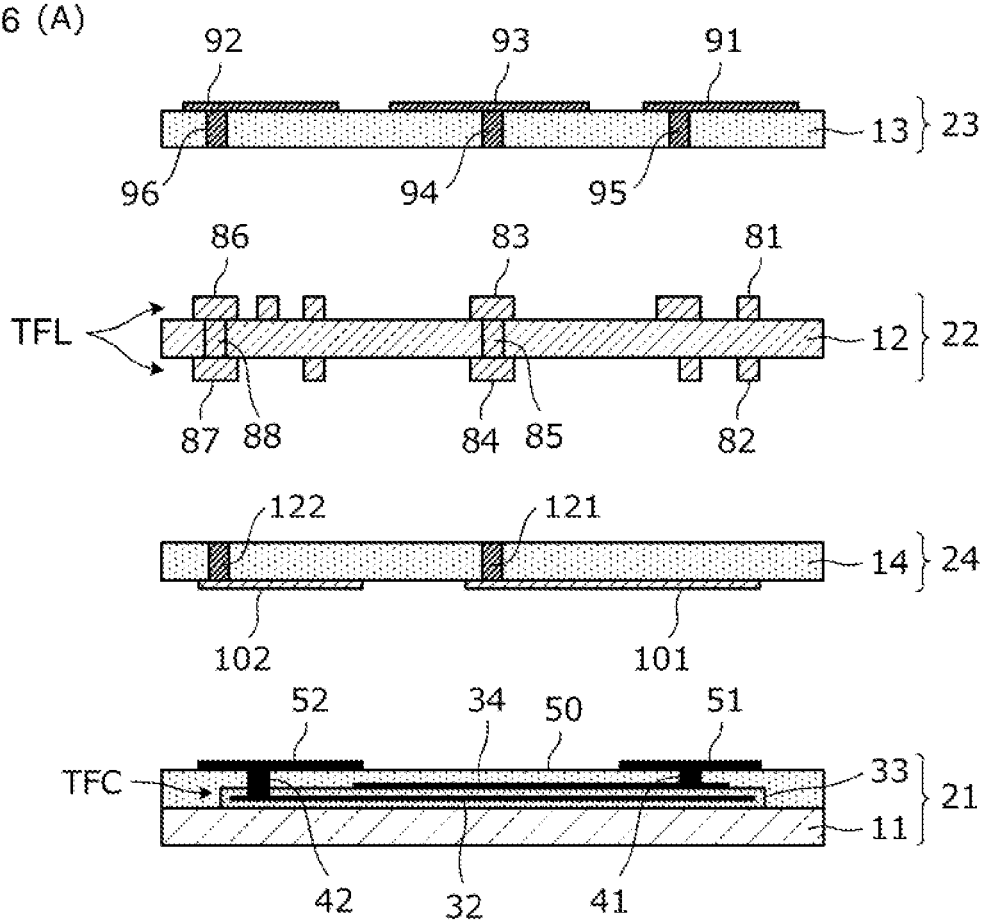
FIG. 6(A) is an exploded cross-sectional view of an LC composite device 203 according to a third embodiment.
FIG. 6(B) is a cross-sectional view of the LC composite device 203.
Figure 6:
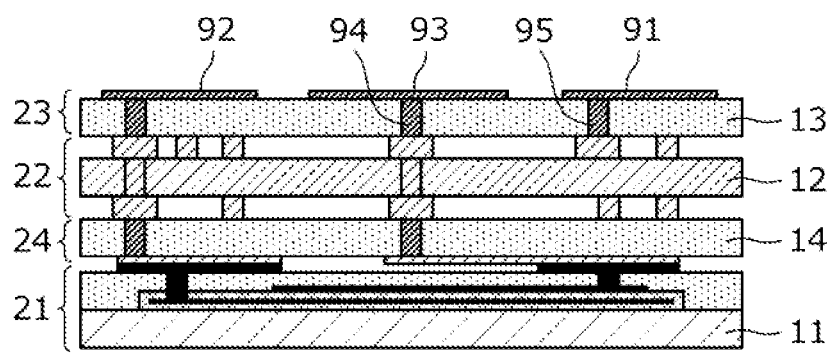
Figure 7:
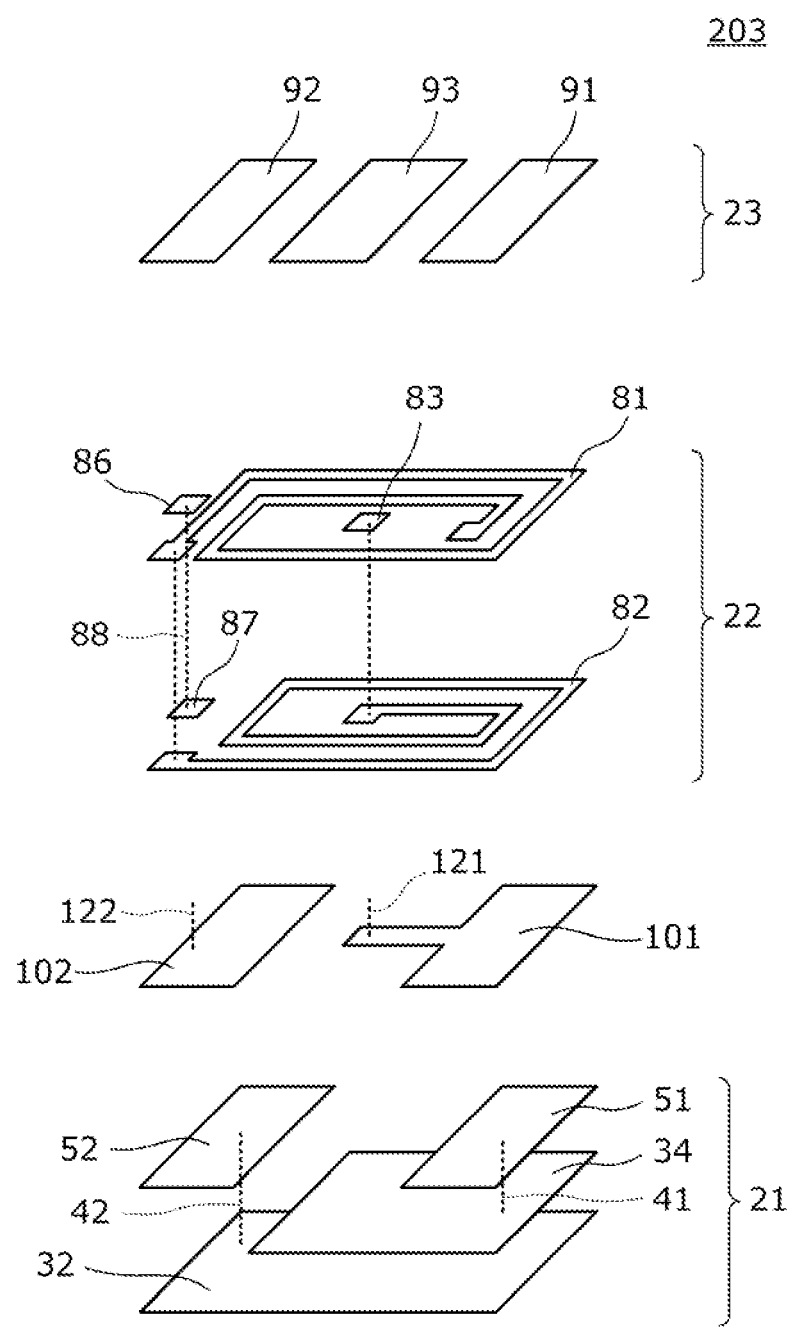
FIG. 7 is an exploded perspective view of the LC composite device 203.

FIG. 6(A) is an exploded cross-sectional view of an LC composite device 203 according to a third embodiment, FIG. 6(B) is a cross-sectional view of the LC composite device 203. Additionally, FIG. 7 is an exploded perspective view of the LC composite device 203. Note that, in order to clearly illustrate formation of various types of conductor patterns, FIG. 7 illustrates while excluding the first substrate 11, the second substrate 12, and the magnetic substrates 13 and 14.

The LC composite device 203 of the present embodiment includes the capacitor portion 21, the inductor portion 22, and the magnetic body portion 23. The capacitor portion 21 is configured of the first substrate 11 and the thin film capacitance element TFC formed on the first substrate 11 through the thin film process, the inductor portion 22 is configured of the second substrate 12 and the thin film inductance element TFL formed on the second substrate 12 through the thin film process.

The LC composite device 203 includes the inductor portion 22 in which two coil conductor patterns 81 and 82 are formed. As illustrated in FIGS. 6(A) and 6(B), the inductor portion 22 is sandwiched between the magnetic body portions 23 and 24.

On the first surface of the second substrate 12, the coil conductor pattern 81 and the surface electrode 83 and a surface electrode 86 are formed. On the second surface of the second substrate 12, the coil conductor pattern 82 and surface electrodes 84 and 87 are formed. The coil conductor patterns 81 and 82 are both preferably rectangular and spiral in shape.

Additionally, in the second substrate 12, a via conductor 85 connecting the surface electrode 83 and the surface electrode 84 to be an inner terminal end of the coil conductor pattern 82, a via conductor 88 connecting the surface electrode 86 and the surface electrode 87, and a via conductor connecting the outer terminal end of the coil conductor pattern 81 and an outer terminal end of the coil conductor pattern 82 are each formed.

On a second surface of the magnetic substrate 14, the surface electrodes 101 and 102 are formed. Additionally, in the inside of the magnetic substrate 14, the via conductors 121 and 122 respectively conducted to the surface electrodes 101 and 102 are each formed. Other configurations are the same as those of the first and second embodiments.

By stacking, and then heating and pressurizing the capacitor portion 21, the inductor portion 22, and the magnetic body portions 23 and 24, as illustrated in FIG. 6(B), a multilayer body thereof is configured. This multilayer body is the LC composite device 203.

In this state, the surface electrodes 51 and 52 of the capacitor portion 21 are conducted to the surface electrodes 101 and 102 of the magnetic substrate 14, respectively, and the via conductors 121 and 122 of the magnetic substrate 14 are conducted to the surface electrodes 84 and 87 of the second substrate 12, respectively. Additionally, the surface electrodes 83 and 86 and the inner terminal end of the coil conductor pattern 81 of the inductor portion 22 are respectively conducted to the external terminals 93, 92, and 91 with the via conductors 94, 96, and 95 of the magnetic substrate 13 interposed therebetween.

According to the present embodiment, both the surfaces of the second substrate 12 can be effectively used, the coil conductor patterns with many turns can be formed, and inductance of the inductor portion 22 can be increased without increasing the area thereof.

An example of a processor connected to a smoothing circuit according to the present invention will be described.

Figure 8:
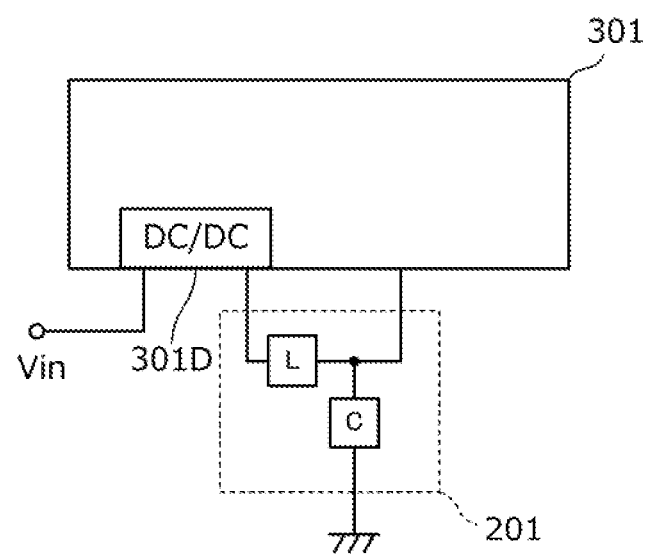
FIG. 8 is a conceptual diagram illustrating a connection structure of a smoothing circuit and a processor.

FIG. 8 is a conceptual diagram illustrating a smoothing circuit connected to a processor. A processor chip 301 is, for example, a chip of an application processor, and includes a switching circuit 301D of a switching power supply circuit. The switching circuit 301D includes a switching element of a DC/DC converter and a switching control circuit thereof. The LC composite device 201 is provided outside of the processor chip 301, and connected to the switching circuit 301D with a wiring pattern interposed therebetween.

Figure 9:
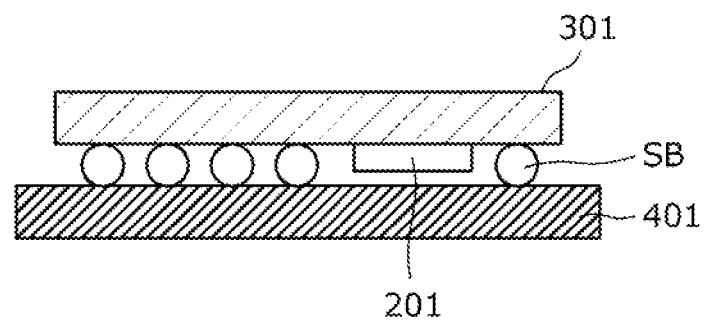
FIG. 9 is a diagram illustrating a mounting structure of the LC composite device 201 and a mounting structure of a processor chip 301.

FIG. 9 is a diagram illustrating a mounting structure of the LC composite device 201 and a mounting structure of the processor chip 301. The processor chip 301 is an integrated circuit in a bare chip state, solder balls SB are attached to a plurality of pads for an external connection. Additionally, the LC composite device 201 is attached to a pad connected to the above-described power supply circuit.

The processor chip 301 to which the solder balls SB and the LC composite device 201 are attached is mounted on a printed wiring board 401.

The processor chip 301 with the LC composite device 201 illustrated in FIG. 9 is, for example, obtained through the following methods.

(1) In a wafer state before being divided into the processor chip, the solder balls SB are mounted on positions excluding the mounting position of the LC composite device 201 on the wafer.

(2) Solder balls are mounted on the external terminals 91, 92, and 93 (e.g., FIG. 1A) of the LC composite device 201, flux is applied to the solder balls or the wafer side, and the LC composite device 201 is mounted on the wafer.

(3) The LC composite device 201 is mounted on the wafer through a reflow process.

(4) The wafer is cut with a dicing machine through a dicing process, the processor chip 301 with the LC composite device 201 is configured.

By surface-mounting the above-described processor chip 301 with the LC composite device 201 on the printed wiring board 401, the LC composite device 201 is disposed in a gap between the processor chip 301 and the printed wiring board 401.

Note that, the LC composite device 201 may be mounted on the printed wiring board 401 side, and the LC composite device 201 may be connected to the power supply circuit of the processor chip 301 with the wiring pattern formed on the printed wiring board 401 interposed therebetween.

A plurality of application examples of the LC composite device to the power supply circuit will be described.

Figure 10:
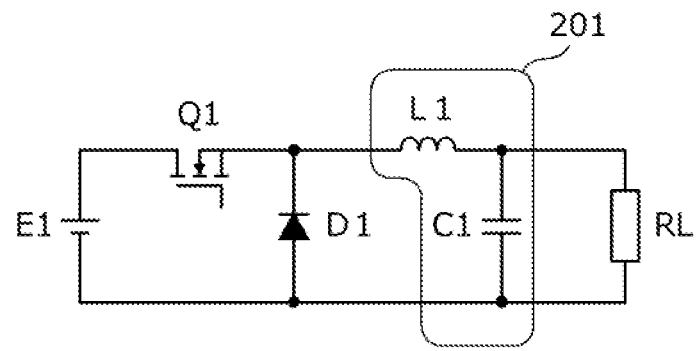
FIGS. 10(A), 10(B), and 10(C) are circuit diagrams illustrating a plurality of application examples of the LC composite device to a power supply circuit.
Figure 10:
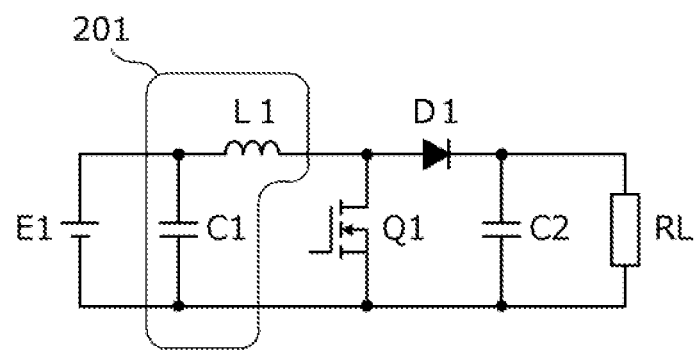
Figure 10:
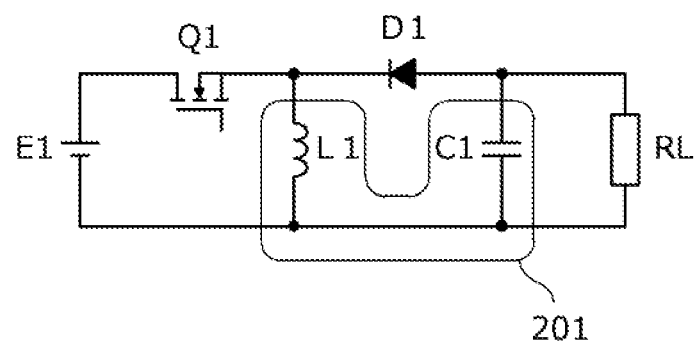

FIG. 10(A) is a basic circuit diagram of a step-down chopper. The step-down chopper is configured of a switching element Q1, a diode D1, the inductor L1, and the capacitor C1 and steps down a voltage of an input power supply E1 and supplies a predetermined power supply voltage to a load RL.

In a case of being applied to this type power supply circuit, the inductor L1 and the capacitor C1 are configured by the LC composite device 201.

FIG. 10(B) is a basic circuit diagram of a step-up chopper. The step-up chopper is configured of the switching element Q1, the diode D1, the inductor L1, and the capacitor C1 and a capacitor C2 and steps up the voltage of the input power supply E1, and supplies a predetermined power supply voltage to the load RL.

In a case of being applied to this type power supply circuit, the inductor L1 and the capacitor C1 on the input side are configured by the LC composite device 201.

FIG. 10(C) is a basic circuit diagram of a step-up/step-down chopper. The step-up/step-down chopper is configured of the switching element Q1, the diode D1, the inductor L1, and the capacitor C1 and steps up or steps down the voltage of the input power supply E1, and supplies a predetermined power supply voltage to the load RL.

In a case of being applied to this type power supply circuit, the inductor L1 and the capacitor C1 are configured by the LC composite device 201.

Although the examples in which the LC composite device is applied to the switching power supply circuit have been described above, the LC composite device of the present invention can also be applied to various types of signal processing circuits such as a filter, a phase shifter, or the like other than the power supply circuit.

Finally, the descriptions of the above-described embodiments are in all ways as exemplary and in no ways limiting. Variations and changes can be made as appropriate by those skilled in the art. The scope of the present invention is defined not by the above embodiments but by the appended claims. Furthermore, the scope of the present invention includes all modifications within the scope and meaning equivalent to the appended claims.

REFERENCE SIGNS LIST

C1, C2 CAPACITOR
D1 DIODE
E1 INPUT POWER SUPPLY
L1 INDUCTOR
P1, P2, P3 TERMINAL
Q1 SWITCHING ELEMENT
RL LOAD
SB SOLDER BALL
TFC THIN FILM CAPACITANCE ELEMENT
TFL THIN FILM INDUCTANCE ELEMENT
11 FIRST SUBSTRATE
12 SECOND SUBSTRATE
13, 14 MAGNETIC SUBSTRATE
21 CAPACITOR PORTION
22 INDUCTOR PORTION
23, 24 MAGNETIC BODY PORTION
32 LOWER CAPACITOR ELECTRODE
33 DIELECTRIC LAYER
34 UPPER CAPACITOR ELECTRODE
41, 42 VIA CONDUCTOR
50 INSULATING FILM
51, 52 SURFACE ELECTRODE
61, 62 SURFACE ELECTRODE
71, 72 VIA CONDUCTOR
81, 82 COIL CONDUCTOR PATTERN
83, 84, 86, 87 SURFACE ELECTRODE
85, 88 VIA CONDUCTOR
91, 92, 93 EXTERNAL TERMINAL
94, 95, 96 VIA CONDUCTOR
101, 102, 111, 112 SURFACE ELECTRODE
121, 122 VIA CONDUCTOR
201 to 203 LC COMPOSITE DEVICE
301 PROCESSOR CHIP
301D SWITCHING CIRCUIT
401 PRINTED WIRING BOARD

The invention claimed is:

1. An LC composite device, comprising:
a capacitor portion comprising a first substrate and a thin film capacitance element located on the first substrate;
an inductor portion comprising a second substrate and a coil shaped thin film inductance element, the thin film inductance element being located on the second substrate, the second substrate being located between the capacitor portion and the thin film inductance element such that the thin film inductance element is located on top of the second substrate; and
a magnetic body portion comprising a magnetic substrate, wherein the capacitor portion, the inductor portion, and the magnetic body portion are stacked in a positional relationship in which the magnetic body portion and the inductor portion are in contact with each other.

2. The LC composite device according to claim 1, wherein the magnetic body portion is a first magnetic body portion and the LC composite device further comprises a second magnetic body portion, the inductor portion being sandwiched between the first and second magnetic body portions.

3. The LC composite device according to claim 2, wherein the magnetic substrate of the first magnetic body portion has an outer surface on which a plurality of external terminals formed, each of the external terminals being electrically connected to a respective one of the thin film capacitance element and the thin film inductance element.

4. The LC composite device according to claim 3, wherein the outer surface of the magnetic body portion is an outer surface of the LC composite device.

5. The LC composite device according to claim 1, wherein the magnetic substrate has an outer surface on which a plurality of external terminals formed, each of the external terminals being electrically connected to a respective one of the thin film capacitance element and the thin film inductance element.

6. The LC composite device according to claim 5, wherein the first substrate is a semiconductor substrate, the second substrate is a glass substrate, and the magnetic substrate is a magnetic body ferrite board.

7. The LC composite device according to claim 3, wherein the first substrate is a semiconductor substrate, the second substrate is a glass substrate, and the magnetic substrate is a magnetic body ferrite board.

8. The LC composite device according to claim 2, wherein the first substrate is a semiconductor substrate, the second substrate is a glass substrate, and the magnetic substrate is a magnetic body ferrite board.

9. The LC composite device according to claim 1, wherein the first substrate is a semiconductor substrate, the second substrate is a glass substrate, and the magnetic substrate is a magnetic body ferrite board.

10. A combination, comprising:
a processor integrated circuit including a switching circuit of a switching power supply circuit; and
the LC composite device of claim 1, the LC composite device being connected to the switching circuit.

11. A method for manufacturing an LC composite device comprising:
- forming a capacitor portion by forming a thin film capacitance element on a first substrate;
- forming an inductor portion by forming a coil shaped thin film inductance element on top of a second substrate such that the second substrate is located between the capacitor portion and the thin film inductance element;
- forming a magnetic portion by forming a conductor pattern including an external terminal on a magnetic substrate; and
- stacking and integrating the capacitor portion, the inductor portion and the magnetic body portion.

12. The method for manufacturing an LC composite device according to claim 11, wherein the magnetic body portion is a first magnetic body portion and the method further comprises stacking and integrating a second magnetic substrate into the LC composite device such that the inductor portion is sandwiched between the first and second magnetic body portions.

13. The method for manufacturing an LC composite device according to claim 12, further comprising forming a plurality of external electrodes on an outer surface of the magnetic substrate of the first magnetic body portion and forming an electrical connection between each of the external terminals and a respective one of the thin film capacitance element and the thin film inductance element.

14. The method for manufacturing an LC composite device according to claim 11, further comprising forming a plurality of external electrodes on an outer surface of the magnetic substrate and forming an electrical connection between each of the external terminals and a respective one of the thin film capacitance element and the thin film inductance element.

15. The method for manufacturing an LC composite device according to claim 14, wherein the first substrate is a semiconductor substrate, the second substrate is a glass substrate, and the magnetic substrate is a magnetic body ferrite board.

16. The method for manufacturing an LC composite device according to claim 13, wherein the first substrate is a semiconductor substrate, the second substrate is a glass substrate, and the magnetic substrate is a magnetic body ferrite board.

17. The method for manufacturing an LC composite device according to claim 12, wherein the first substrate is a semiconductor substrate, the second substrate is a glass substrate, and the magnetic substrate is a magnetic body ferrite board.

18. The method for manufacturing an LC composite device according to claim 11, wherein the first substrate is a semiconductor substrate, the second substrate is a glass substrate, and the magnetic substrate is a magnetic body ferrite board.

* * * * *